(12) United States Patent
Nag et al.

(10) Patent No.: US 6,424,040 B1
(45) Date of Patent: Jul. 23, 2002

(54) INTEGRATION OF FLUORINATED DIELECTRICS IN MULTI-LEVEL METALLIZATIONS

(75) Inventors: Somnath S. Nag, Saratoga, CA (US); Changming Jin; Wei-Yung Hsu, both of Dallas, TX (US); Guoqiang Xing, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/244,586

(22) Filed: Feb. 4, 1999

Related U.S. Application Data
(60) Provisional application No. 60/073,673, filed on Feb. 4, 1998.

(51) Int. Cl.[7] .......................... H01L 23/48; H01L 23/52
(52) U.S. Cl. .................. 257/751; 257/753; 257/763
(58) Field of Search .......................... 257/760, 751, 257/753, 763, 758, 759, 761, 762; 438/627, 624, 648, 656, 683, 685

(56) References Cited

U.S. PATENT DOCUMENTS

| | | | | |
|---|---|---|---|---|
| 4,742,026 A | * | 5/1988 | Vatus et sl. .................. 437/245 |
| 4,843,042 A | * | 6/1989 | Dole et al. ..................... 501/96 |
| 5,381,040 A | * | 1/1995 | Sun et al. ..................... 257/774 |
| 5,661,334 A | * | 8/1997 | Akram ......................... 257/632 |
| 5,850,102 A | * | 12/1998 | Matsuno ....................... 257/635 |
| 5,886,410 A | * | 3/1999 | Chiang et al. ................ 257/759 |
| 5,889,328 A | * | 3/1999 | Joshi et al. .................. 257/751 |
| 5,900,672 A | * | 5/1999 | Chan et al. ................... 257/751 |
| 5,903,053 A | * | 5/1999 | Iijima et al. ................. 257/751 |
| 6,054,380 A | * | 4/2000 | Naik ........................... 438/624 |
| 6,071,816 A | * | 6/2000 | Watts et al. ................. 438/692 |
| 6,077,774 A | * | 6/2000 | Hong et al. .................. 438/643 |

* cited by examiner

*Primary Examiner*—Steven Loke
*Assistant Examiner*—Douglas W. Owens
(74) *Attorney, Agent, or Firm*—Lawrence J. Bassuk; W. James Brady; Frederick J. Telecky, Jr.

(57) ABSTRACT

Deposition of titanium over fluoride-containing dielectrics requires the use of a method of passivation to prevent the formation of TiF4, which causes delamination of the metallization structure. Disclosed methods include the formation of layers of Al2O3, TiN, or Si3N4.

2 Claims, 3 Drawing Sheets

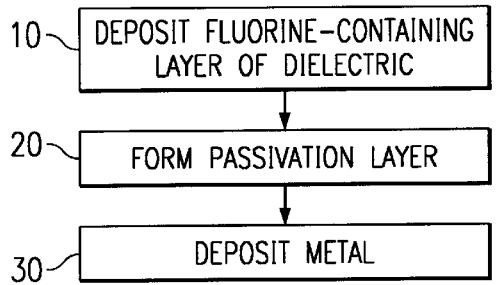
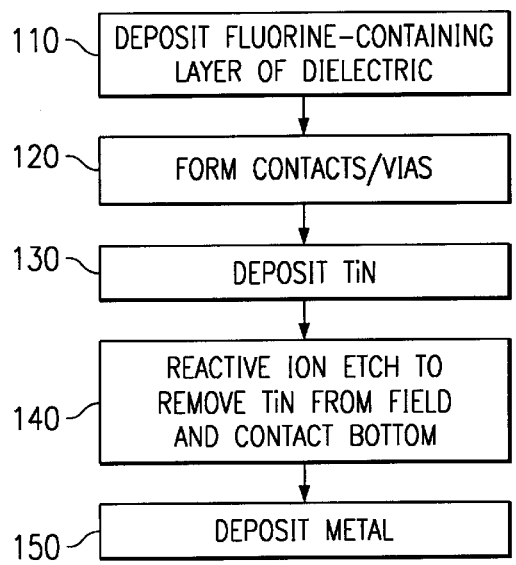
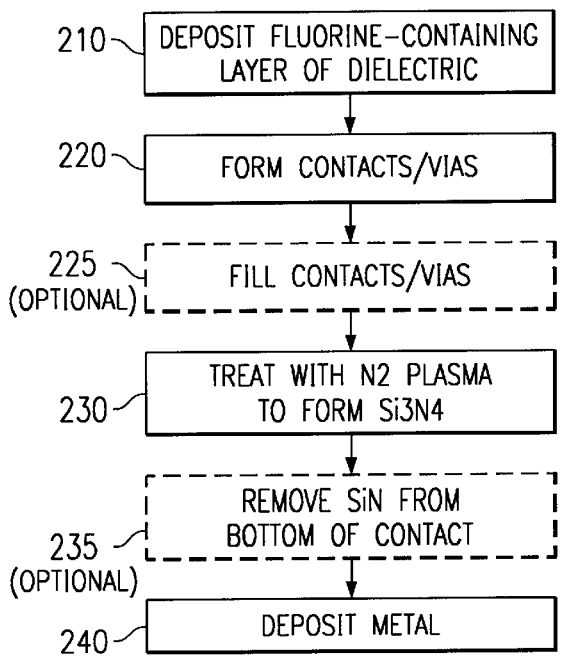
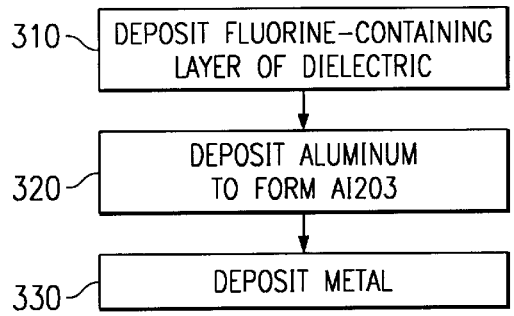

INTEGRATION OF FLUORINATED DIELECTRICS IN MULTI-LEVEL METALLIZATIONS

This application claims priority under 35 USC § 119 (e)(1) of provisional application No. 60/073,673, filed Feb. 4, 1998.

BACKGROUND AND SUMMARY OF THE INVENTION

The present invention relates to integrated circuit structures and fabrication methods, and particularly to the integration of fluorine containing oxides in standard interconnect metallization.

BACKGROUND

Metals in Interconnect Structures

Due to the many desired properties of conductor structures in integrated circuits, the number of metals which are used is very small. Much work is being done on the use of copper for metallization, but currently, the majority of circuits use aluminum (Tungsten is also used in some cases.) These two metals will typically have adhesion/barrier layers between them and the dielectric layer, so that typical metallizations use a sandwich of, e.g. Ti/TiN/Al/TiN or Ti/TiN/W.

BACKGROUND

Dielectrics in Interconnect Structures

There are also many constraints on the dielectrics which are used in integrated circuits. Typical dielectrics are doped CVD SiO2, TEOS-based SiO2 films, PECVD silicon nitrides, bias-sputtered SiO2, polyimides, and spin-on glasses. For further information, see S. Wolf, *Silicon Processing for the VLSI Era: Volume 2–Process Integration* (1990), which is hereby incorporated by reference.

BACKGROUND

Fluoro-Silicate Glass (FSG) in Interconnect Structures

It is desirable to, be able to integrate fluorine-containing dielectrics, such as fluoro-silicate glass (FSG), into the standard interconnect metallization scheme, as these materials have a low coefficient of permittivity (k). However, use of FSGs in interconnect formation has shown problems of metal "corrosion" and metal delamination at high fluorine concentrations. This is seen as a delamination of the metal film from the dielectric and appears when the subsequent metallization layer is deposited (e.g., metal-2 will exhibit delamination from the underlying FSG only after the metal-3 layer is deposited.

It has been observed that this delamination is seen only when a metal such as titanium is deposited over fluorinated oxides and not when FSG is deposited over the metal. Additionally, peeling is not observed when TiN is deposited over fluorinated oxide, or when FSG is deposited over TiN.

FSG films on Si wafers used for film measurements have been found to be stable even with F content >16% at (K≦3.0). Various test methods, including MOSCAP measurements and Thermal Desorption Spectroscopy, which have been performed on these films at various stages—as deposited, after temperature cycling at 450–500 C for 30 minutes, after moisture-stressing and over time—indicate that the films by themselves are stable. However, integration of these FSG's pose challenges due to the above-mentioned interactions with the metal stack during integration.

Innovative Structures and Methods

The present inventors have realized that the adhesion problems which occur when a layer of metal is deposited on a fluorine-containing dielectric are due to a reaction between available surface fluorine atoms and the lowest deposited layer of metal atoms. When the activated metal, such as titanium, strikes the FSG, they combine to form fluorides, such as TiF4. TiF4, as an example, will sublime around 250–270 degrees C, which is far below the current metallization temperatures of 400 or greater. This, then, is the cause of the drastically reduced adhesion between a metallic layer and the fluorine-containing dielectric which have been observed, and which is illustrated in FIG. 3. Here metal layer 80 was deposited over fluorine-containing dielectric 50, with the resultant formation of fluoride layer 100. At the left of the figure, the volatilization of the fluoride layer 100 allows the delamination of metal 80. The reaction shown does not occur when the metal is deposited first, since it can already have a passivating oxidation layer, which appears to prevent further reaction. While the use of thick undoped oxide over the fluorine-containing dielectric may work, this would reduce the advantage of a low-k dielectric. The present application discloses forming a passivation layer over a fluorine-containing dielectric to prevent reaction of the fluorine with metal. This passivation may take several forms:

a.) a very thin layer of aluminum (e.g., 30 nm) can be deposited over a blanket dielectric, with the formation of Al2O3 on its surface;

b.) a layer of titanium nitride, or alternatively tungsten nitride (WN) or tantalum nitride (TaN), can be used to line the sidewalls of contacts or vias;

c.) a layer of silicon nitrides can be formed on the surface of the FSG by treatment with an N2 plasma.

These passivation layers can be used to prevent the reaction of a fluorine-containing dielectric with titanium, tantalum, tungsten, molybdenum, etc., wherever the metal fluorides are volatile at subsequent processing temperatures.

Advantages of the disclosed methods and structures include:

prevents delamination of metallization from dielectric;

at most, two additional steps are necessary;

uses conventional equipment and processes.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 is a flow chart showing the steps of the disclosed method.

FIGS. 1A–1C are flow charts showing several embodiments of the disclosed method.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

While specific embodiments are discussed below, the process can been seen to have basically three steps, as shown in FIG. 1. First a layer of a fluorine-containing dielectric is deposited on the integrated circuit (step 10). This may be deposited directly over the gate and active areas, or over previous metallization levels. After the dielectric is deposited, contacts or vias will be formed, as well as trenches, if damascene metallization is used. Next, a passivation layer is formed (step 20) over areas where the fluorine-containing dielectric would contact metal. The specific passivation layer formed, and the method of its formation, depends on whether the contact would be in the contacts, vias, and trenches, on the upper surface of the dielectric, or both. Once this passivation layer is in place, the metal, such as titanium, can be deposited (step 30) without fear of a resulting reaction and delamination. Further steps can then proceed with the deposition of the desired metallization, e.g., tungsten 95, as shown in FIGS. 2A.

FIRST PROCESS EMBODIMENT

Passivation with TiN

Figure 2A:
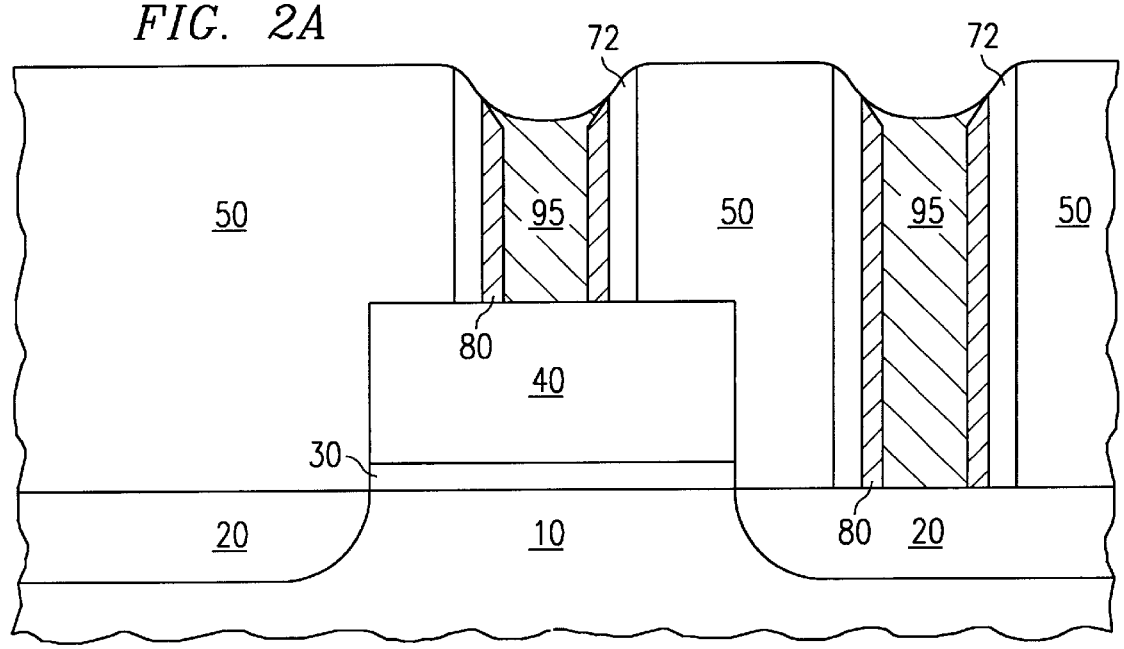
FIGS. 2A–2C show partially fabricated integrated circuits in which various embodiments of the disclosed passivation schemes are used.

The first embodiment of the disclosed process is shown in FIG. 1A, with FIG. 2A showing the resulting structure. This embodiment is primarily used in the formation of plugs which would otherwise contain a layer of metal, e.g., an adhesive layer of titanium, in contact with the fluorine-containing dielectric. Although the illustration and discussion for the disclosed embodiments shows a contact being formed, this method is also applicable to via formation. Shown in FIG. 2A is gate 40 on gate oxide 30 and substrate 10, which contains the active areas 20. Once these are formed, a layer of fluoro-silicate glass (FSG) 50 is deposited (step 110) and contacts are formed in the dielectric (step 120). A layer of TiN is deposited (step 130) to a thickness of approximately 5–10 nm, providing a conformal layer overall. This conformal layer is etched by a reactive ion etch (step 140) to remove the TiN from the bottom of the contact and from the surface of dielectric layer 50. This leaves a layer of TiN 72 only on the sidewalls of the contacts, where it passivates the FSG. This step is followed by the deposition (step 150) of layer of titanium 80. Once the titanium layer is in place, the contact will be filled with, e.g. tungsten or other metal 95 over a thin layer of TiN, and the metallization proceeds by known processes.

SECOND PROCESS EMBODIMENT

Passivation with Silicon Nitride

Figure 2B:
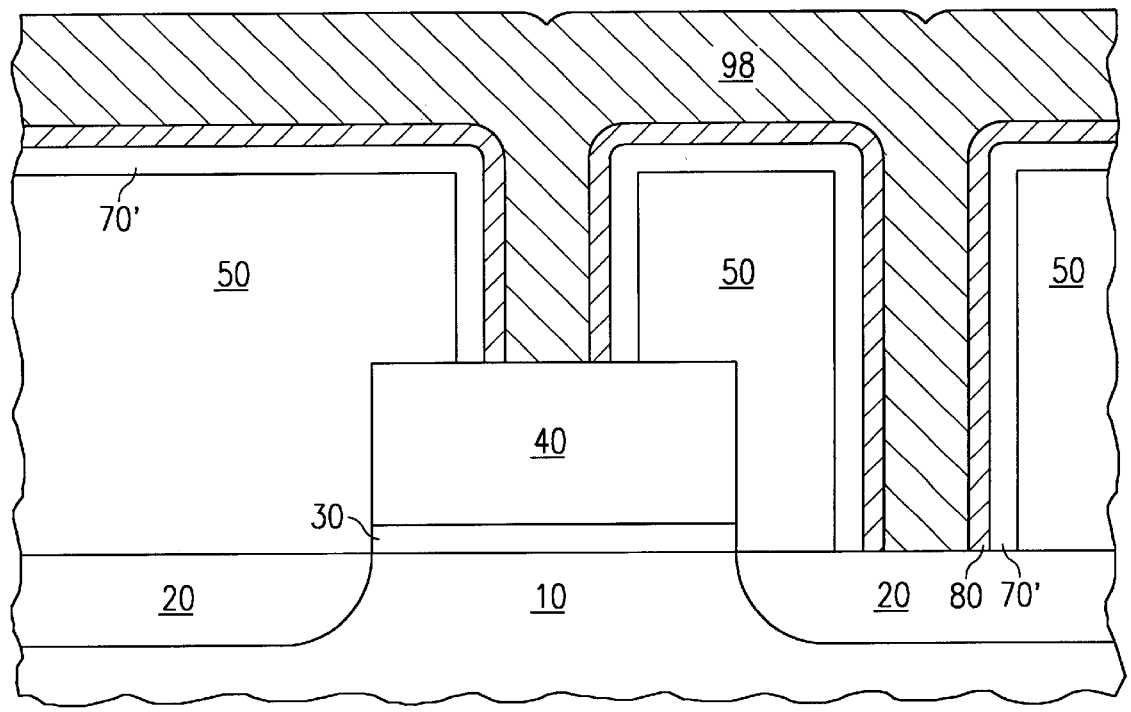

The second embodiment of the disclosed process is shown in FIG. 1B and its structure in FIG. 2B. This embodiment can be used to provide passivation on either the surface or within contacts and vias, although only contacts are shown in the examples. First, FSG layer 50 is deposited (step 210) over the integrated circuit. This is followed by the formation (step 220) of contacts. If titanium (or another metal which forms volatile byproducts with fluorine) is not being used as an adhesive in the contacts, then the contacts can be filled (step 225) at this time in a conventional manner. The wafer is then subjected to a N2 plasma (step 230), to form a passivation layer 70' of silicon nitrides. Note that, depending on exactly where in the process this passivation is performed, this may form passivation layer 70' only on the surface of the dielectric, or on both the surface and within the contacts. The N2 plasma will reduce the active fluorine at the surface of the FSG by forming a 0.3–0.5 nm layer of SiOyNz on the FSG. If this method is being used with contacts, then the SiN layer must be removed from the bottom of the contact (step 235) to ensure good conduction. This step is followed by the deposition (step 240) of titanium 80 and any other necessary diffusion barrier/adhesion layers for the following metallization, such as CVD tungsten or aluminum fill. Shown in the drawing is aluminum layer 98.

THIRD PROCESS EMBODIMENT

Passivation with Al/Al2O3

Figure 2C:
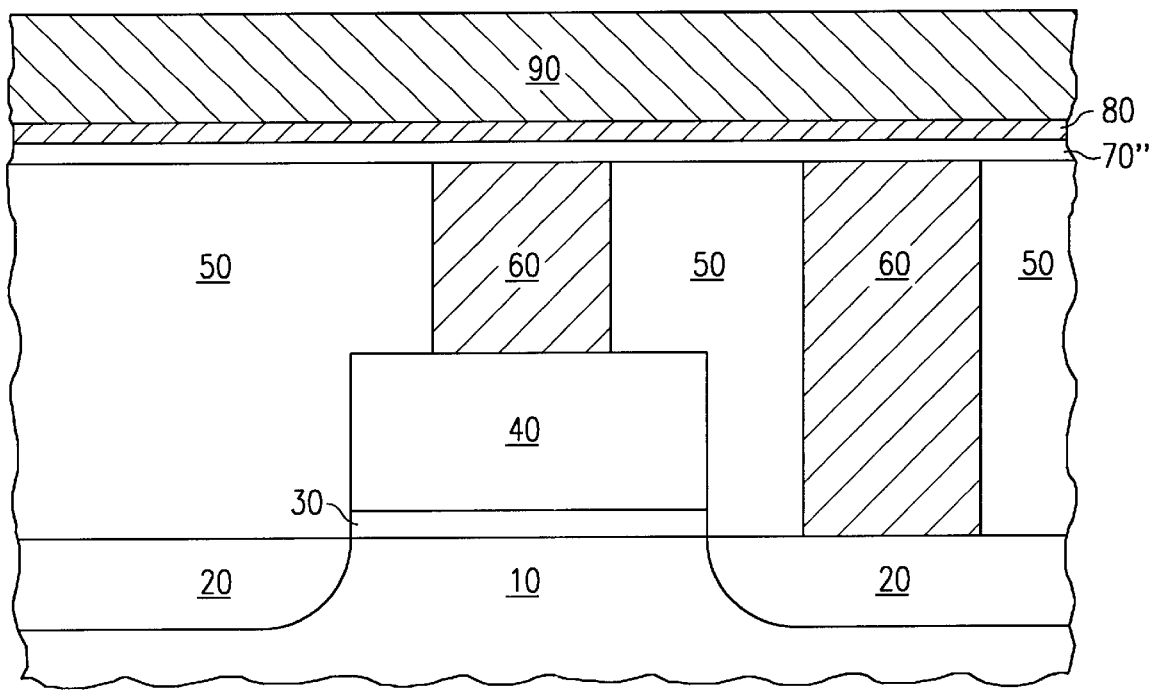
Figure 3:
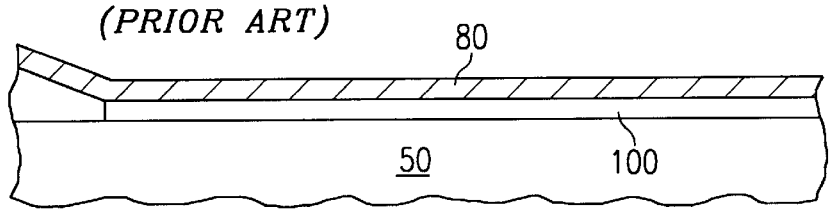
FIG. 3 is a prior art figure showing the layer of TiFx which forms between deposited titanium and the underlying FSG.

A less preferred embodiment of the disclosed process is shown in FIG. 1C, while FIG. 2C shows the resulting structure. This embodiment is primarily used when titanium will be deposited on the surface of the interlevel dielectric (ILD), but not in the contacts. FSG layer 50 is deposited on the device structure (step 310), using known methods. Contacts or vias will be formed and filled at this point, but are not discussed here, since this method is not desirable in contacts or vias. This is followed by the deposition (step 320) of a layer of aluminum about 30 nm thick. This aluminum will then react with the ambient atmosphere so that passivation layer 70" is aluminum with a thin layer of Al2O3. With the FSG layer covered by passivation layer 70, deposition (step 330) of titanium layer 80 can proceed without formation of TiF4, and the resulting loss of adhesion. The metallization will then continue with the deposition of, e.g., aluminum layer 90.

Alternate Embodiments with Various Metal Layers

Although the three process embodiments above have been discussed with regard to titanium over a fluorine containing dielectric layer, the disclosed methods can be used with other metals which form metal fluorides that are volatile at subsequent processing temperatures. These include tantalum, tungsten, molybdenum, etc.

Alternate Embodiments with Various Dielectric Layers

Other fluorine containing dielectrics besides FSG can be used in the disclosed embodiments. Examples are fluoro-polymers, such as fluorinated polyimide, or perfluorocyclobutane. (PFCB).

Alternate Embodiments with Various Metal Nitride Layers

Besides the titanium nitride passivation layer described in the first embodiment, other metal nitride layers (such as WN, TaN, AlN, CrN, TiAlN, TaAlN, WAlN), including ternary or greater nitrides (such as TiSiN, TiBN, TaSiN), can be used as the passivation layer.

First Metallization Process Embodiment (Damascene)

The disclosed process can be used to prevent delamination of titanium from fluorine-containing dielectrics in a damascene process. In this process, after the dielectric is formed, grooves will be cut where metallization lines are desired, with contacts providing connection between metallization in the groove and structures below. Passivation with either silicon nitride or titanium nitride can be used with formation of the proper passivation layer taking place just before deposition of titanium.

Second Metallization Process Embodiment

The disclosed process can also be used in conventional metallizations. Using the three disclosed embodiments, one can insert the desired passivation layer to provide protection where needed. In some instances, i.e., when plug formation prior to the metallization of the patterned layer is combined with use of titanium in both the contact and on the surface, it may be necessary to provide two separate passivation steps to provide optimal protection.

According to a disclosed class of innovative embodiments, there is provided: An integrated circuit structure, comprising: a semicondutor device; a layer of a fluorine-containing dielectric overlying said semiconductor device; a passivation layer which directly overlies said fluorine-containing dielectric; a layer of metal directly overlying said passivation layer, wherein said metal can form a compound with fluorine which is volatile at processing temperatures of overlying layers; whereby said passivation layer prevents delamination of said metal from said fluorine-containing dielectric.

According to another disclosed class of innovative embodiments, there is provided: An integrated circuit structure, comprising: a semiconductor device; a layer of a fluorine-containing dielectric overlying said semiconductor device; a passivation layer which directly overlies said fluorine-containing dielectric; a layer of a first metal directly overlying said passivation layer, wherein said first metal can form a compound with fluorine which is volatile at processing temperatures of overlying layers; a layer of a second metal overlying said layer of a first metal, said second metal extending through contacts in said fluorine-containing dielectric to contact a conductive layer, said layer of said second metal being thicker than said layer of said first metal; whereby said passivation layer prevents delamination of said first metal from said fluorine-containing dielectric.

According to another disclosed class of innovative embodiments, there is provided: A fabrication method, comprising the steps of: (a.) providing a semiconductor material in which an active device has been at least partially formed; (b.) depositing a layer of a fluorine-containing dielectric; (c.) forming a passivation layer in contact with. said fluorine-containing dielectric; (d.) depositing a metal in contact with said passivation layer, said metal being one which can form a compound with fluorine which is volatile at subsequent processing temperatures; whereby said passivation layer prevents delamination of said metal from said fluorine-containing dielectric.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit structure, comprising:
    a semiconductor device;
    a layer of a fluorine-containing dielectric overlying said semi-conductor device;
    a passivation layer which directly overlies said fluorine-containing dielectric;
    a layer of a first metal directly overlying said passivation layer, wherein said first metal can form a compound with fluorine which is volatile at processing temperatures of overlying layers;
    a layer of a second metal overlying said layer of a first metal, said second metal extending through contacts in said fluorine-containing dielectric to contact a conductive layer, said layer of said second metal being thicker than said layer of said first metal;
    whereby said passivation layer prevents delamination of said first metal from said fluorine-containing dielectric.

2. The integrated circuit of claim 1, wherein said passivation layer has a thickness of less than 10 nm.

\* \* \* \* \*